(12) United States Patent
Tsuchiya et al.

(10) Patent No.: US 6,504,384 B1
(45) Date of Patent: Jan. 7, 2003

(54) APPARATUS OF MEASURING CAPACITANCE AND METHOD THEREOF

(75) Inventors: Masamichi Tsuchiya, Ota-Ku (JP); Takamasa Nagasawa, Ota-Ku (JP)

(73) Assignee: Tokyo Weld Co., Ltd., Tokyo-To (JP)

( * ) Notice: Subject to any disclaimer, the term of this patent is extended or adjusted under 35 U.S.C. 154(b) by 10 days.

(21) Appl. No.: 09/634,584

(22) Filed: Aug. 8, 2000

(51) Int. Cl.$^7$ ............................................... G01R 27/00
(52) U.S. Cl. ........................................ 324/658; 324/679
(58) Field of Search ................................ 324/658, 659, 324/680, 679, 611

(56) References Cited

U.S. PATENT DOCUMENTS

| | | | | |
|---|---|---|---|---|
| 3,255,410 A | * | 6/1966 | Norwich | 324/665 |
| 3,579,101 A | * | 5/1971 | Kusters et al. | 324/679 |
| 3,718,856 A | * | 2/1973 | Hendriks | 324/658 |
| 3,761,806 A | * | 9/1973 | Napor et al. | 324/658 |
| 4,267,503 A | * | 5/1981 | Westra | 324/659 |
| 4,426,616 A | * | 1/1984 | Maier | 324/658 |
| 4,737,706 A | * | 4/1988 | Eilersen | 324/611 |
| 5,113,140 A | * | 5/1992 | So | 324/680 |

* cited by examiner

*Primary Examiner*—N. Le
*Assistant Examiner*—Vincent Q. Nguyen
(74) *Attorney, Agent, or Firm*—Jacobson Holman PLLC

(57) ABSTRACT

The present invention prevents from occurring a measurement error of electrical capacitance based on variance of a voltage applied to capacitors. An apparatus of measuring capacitance has a power supply for applying a voltage to capacitors, a voltmeter of measuring the voltage applied to the capacitors W, and an amperemeter of measuring a current flowing through the capacitors. A capacitance measuring part is connected to the voltmeter and the amperemeter, and measures electrical capacitance and electrical positive electrode of the capacitors based on the voltage and the current applied to the capacitor. A determining part determines whether or not the voltage deflects from the voltage between upper-limit and lower-limit values. When the determining part determines that the voltage changes, the warning part performs warning.

18 Claims, 3 Drawing Sheets

APPARATUS OF MEASURING CAPACITANCE AND METHOD THEREOF

BACKGROUND OF THE INVENTION

1. Field of the Invention

The present invention relates to an apparatus of measuring capacitance and method thereof.

2. Related Background Art

Conventional apparatuses of measuring capacitance are provided with a power supply for applying a voltage to capacitor, a voltmeter of measuring a voltage applied to the capacitor, and an amperemeter of measuring a current flowing through the capacitors when the voltage is applied to the capacitor. The voltage from the voltmeter and the current from the amperemeter are sent to a capacitance measuring part. This capacitance measuring part measures electrical capacitance and dissipation factor.

Incidentally, the electrical capacitance measured by the capacitance measuring part largely depends on voltage value, due to dielectric materials of the capacitors. Because of this, the measuring value of the electrical capacitance rises when the voltage rises, and the measuring value of the electrical capacitance falls when the voltage falls. In such case, it is impossible to measure the electrical capacitance of the capacitors with high accuracy.

SUMMARY OF THE INVENTION

An object of the present invention is to provide an apparatus of measuring capacitance and method thereof it is possible to measure capacitance of capacitors with high accuracy.

To achieve the foregoing object, an apparatus of measuring capacitance, comprising:

a power supply for applying a voltage to a capacitor;

a voltmeter of measuring the voltage applied to the capacitor;

an amperemeter of measuring a current flowing through the capacitor when the voltage is applied to the capacitor;

a determining part for determining whether or not the voltage applied to the capacitor deflects from voltage between upper-limit and lower-limit values, and a capacitance measuring part of measuring electrical capacitance based on signals from said voltmeter and said amperemeter.

According to the present invention, the voltage from the power supply is applied to the capacitors, and the voltage applied to the capacitor is measured by a voltmeter, as well as current flowing through the capacitor is measured by an amperemeter. A capacitance measuring part measures electrical capacitance based on the voltage from the voltmeter and the current from the amperemeter. During the measuring period, whether or not the voltage measured by the voltmeter deflects from a voltage between upper-limit and lower-limit values is determined by a determining part. When determined that the voltage applied to the capacitor does not deflect from the voltage between upper-limit and lower-limit values, the electrical capacitance of the capacitor is measured.

Thus, because the present invention measures the electrical capacitance only at a range that measuring accuracy of the electrical capacitance of the capacitor is high, it is possible to improve the measuring accuracy of the electrical capacitance of the capacitor.

DESCRIPTION OF THE PREFERRED EMBODIMENTS

Hereinafter, an apparatus of measuring capacitance and a method of measuring capacitance will be specifically explained with reference to drawings.

Figure 1:
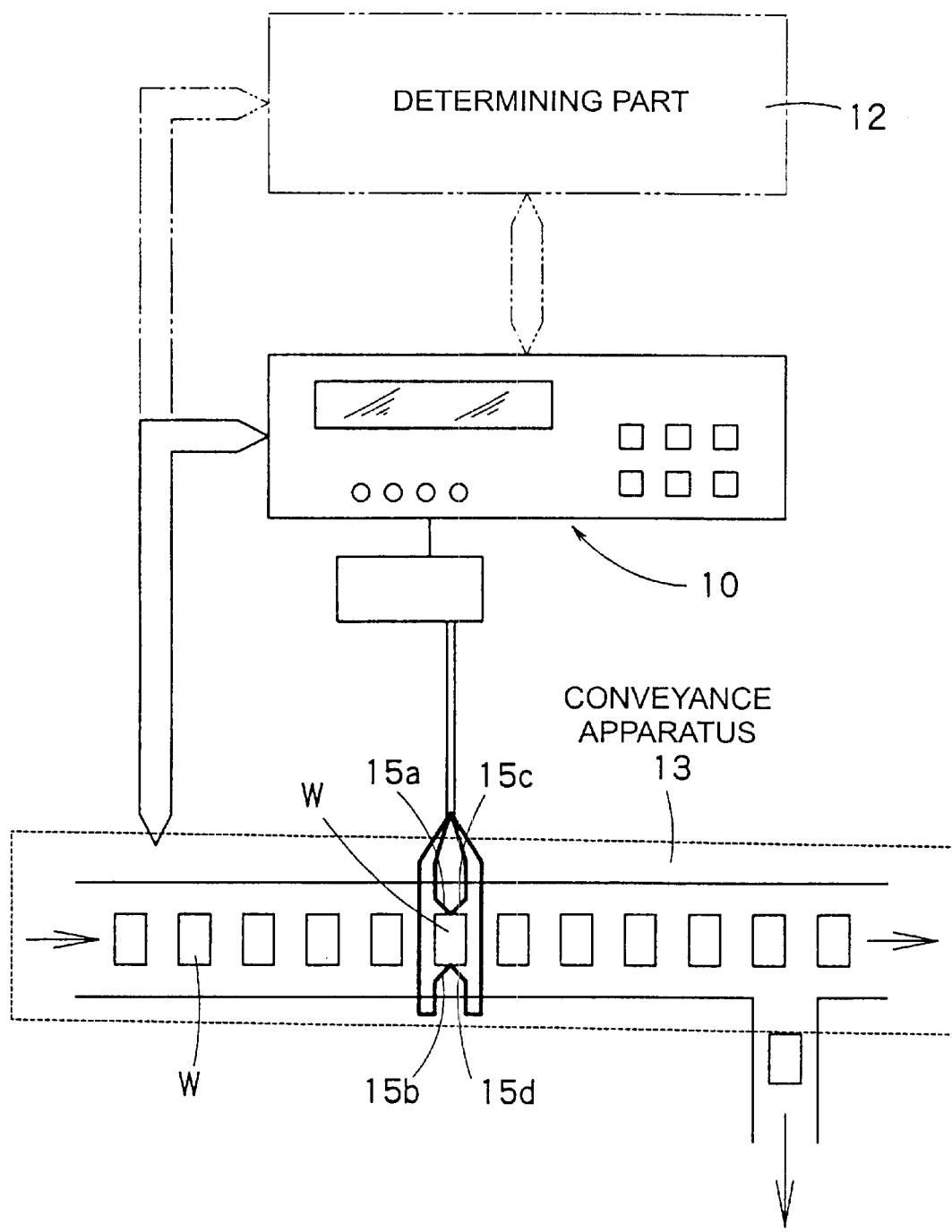
FIG. 1 is a schematic diagram showing overall configuration of a measuring system.

FIG. 1 is a schematic diagram showing overall configuration of a measuring system including an apparatus of measuring the capacitance according to the present invention. The system of FIG. 1 is provided with a conveyance apparatus 13 to convey capacitors W. Four measuring terminals 15a, 15b, 15c and 15d contact to the capacitors W on the conveyance apparatus 13 to proceed electrical measurement of the capacitors W.

The kinds of the capacitors W conveyed by the conveyance apparatus 13 is not specified, for example, the capacitors are chip capacitors of rectangle shape, and have electrodes at both ends.

The measuring terminals 15a and 15b are connected to both ends of the capacitors W for measuring voltage, and the terminals 15c and 15d are connected to both ends of the capacitors W for measuring current. These measuring terminals 15a–15d are connected to the apparatus of measuring capacitance according to the present invention.

Figure 2:
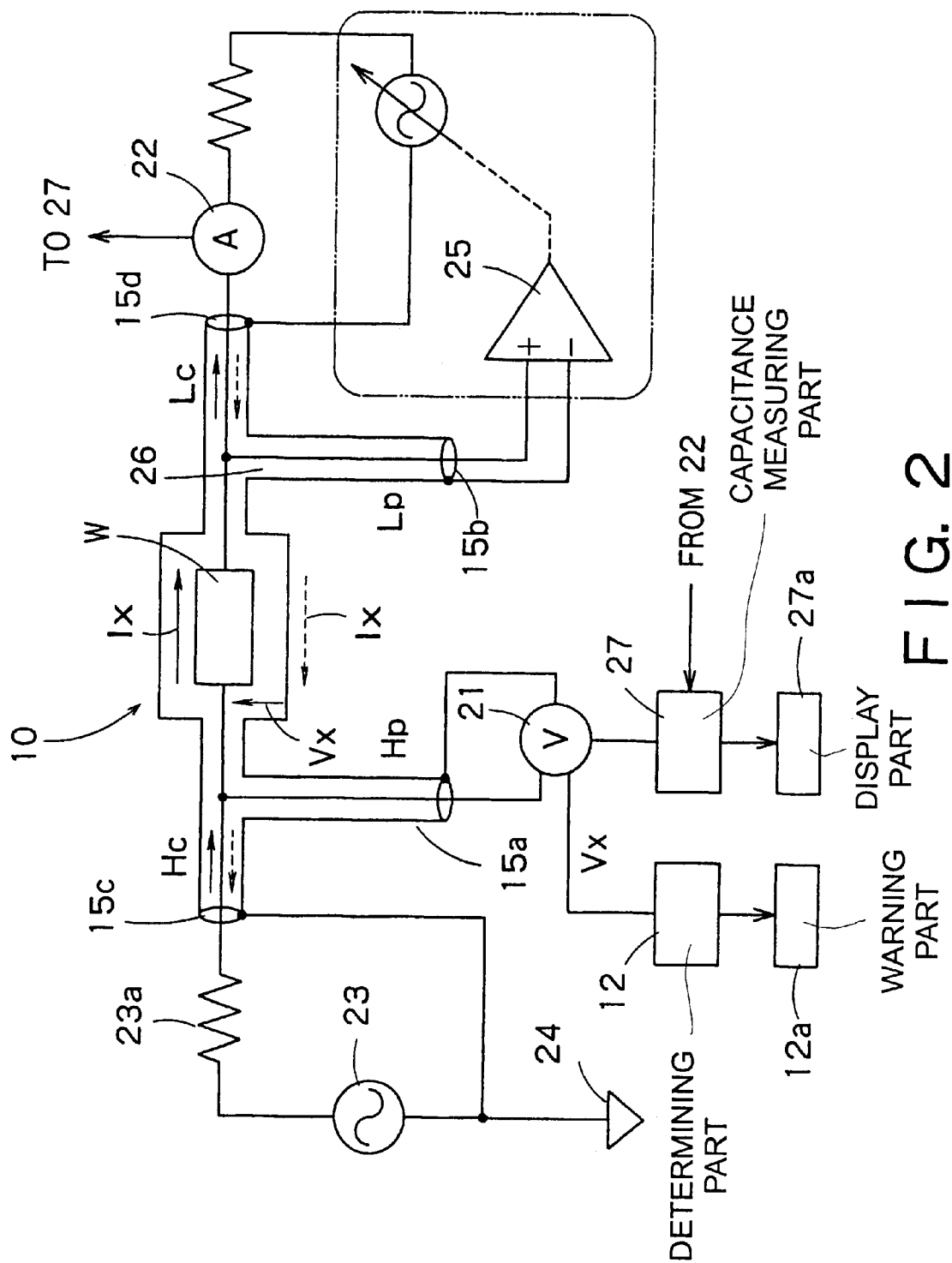
FIG. 2 is a diagram showing a principle of an apparatus of measuring capacitance according to the present invention.

FIG. 2 is a diagram showing a principle of an apparatus of measuring capacitance according to the present invention. The apparatus 10 of measuring capacitance of FIG. 2 has a power supply 23 to apply the voltage to the capacitors W via the resistor 23a, a voltmeter 21 which is connected to the terminals 15a and 15b, to measure the voltage applied to the capacitors W, and an amperemeter 22 which is connected to the terminals 15c and 15d, to measure the current flowing through the capacitors W. The voltmeter 21 and the amperemeter 22 are connected to a capacitance measuring part 27. The capacitance measuring part 27 measures the electrical capacitance of the capacitance W and the dissipation factor based on the voltage measured by the voltmeter 21 and the current measured by the amperemeter 22.

A determining part 12 is connected to the voltmeter 21. The determining part 12 determines whether or not the voltage applied to the capacitors W deflects from voltage between upper-limit and lower-limit voltages. When the determining part 12 determines that the voltage applied to the capacitors deflects from voltage between upper-limit and lower-limit values, the determining result is sent to a warning part 12a, and then the warning part 12a carries out warning process. The kinds of the warning process and how to warn are not specified, for example, the warning is carried out by sound or screen display.

The measuring result of the electrical capacitance and the dissipation factor measured by the capacitance measuring part 27 is displayed by the display part 27a.

The power supply 23 of FIG. 2 is connected to a common ground part 24. The terminal 15b is connected to an auto balance bridge 25. Side of the terminals 15b and 15d of the capacitors W is provided with a virtual ground part 26.

Next, operation of the apparatus of measuring capacitance according to the present embodiment will be explained hereinafter.

First of all, the terminals 15a–15d are contacted to the capacitors W conveyed by the conveyance apparatus. In this case, a prescribed voltage is applied to the capacitors W from the power supply 23.

The voltage applied to the capacitors W is measured by the voltmeter 21 and the current flowing through the capacitors W is measured by the amperemeter 22. The voltage measured by the voltmeter 21 and the current measured by the amperemeter 22 are sent to the capacitance measuring part 27. The capacitance measuring part 27 measures the electrical capacitance and the dissipation factor of the capacitors W based on the measured voltage and current. The electrical capacitance and the dissipation factor measured by the capacitance measuring part 27 are sent to the display part 27a to display the electrical capacitance and the dissipation factor.

During this period, the voltage measured by the voltmeter is sent to the determining part 12. The determining part 12 determines whether or not the voltage applied to the capacitor deflects from voltage between the upper-limit and lower-limit values. When determined that the voltage applied to the capacitors deflects from the voltage between the upper-limit and lower-limit values, the warning part 12a carries out the warning process. Following to this warning, the measurement of the electrical capacitance of the capacitors is stopped automatically or manually.

Figure 3:
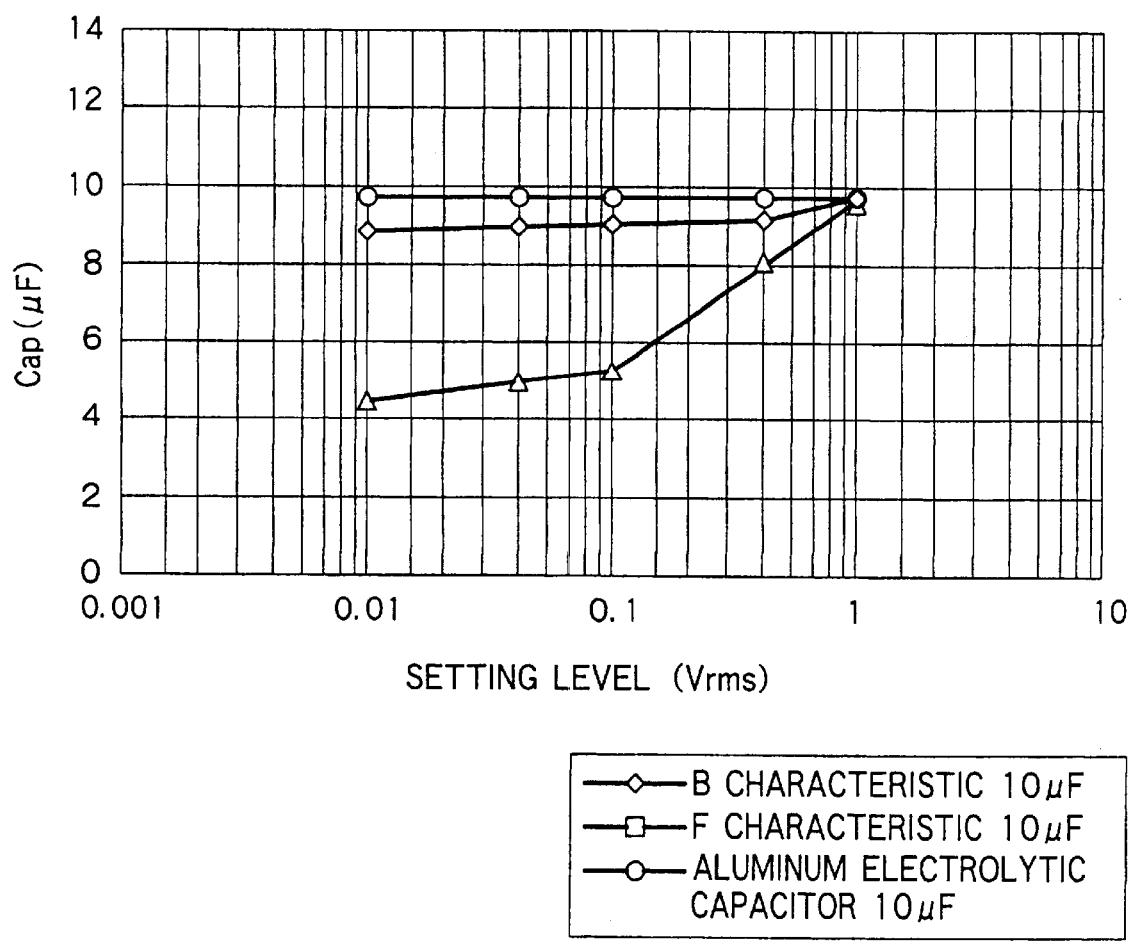
FIG. 3 is a property diagram showing a relationship between the voltage [Vrms] applied to the capacitors and the electrical capacitance [$\mu$F].

FIG. 3 is a property diagram showing a relationship between the voltage [Vrms] applied to the capacitors and the electrical capacitance [$\mu$F]. The properties of 101JF capacitor with B characteristic, 10 $\mu$F capacitor with F characteristic and 10 $\mu$F aluminum electrolytic capacitor are shown in FIG. 3.

As shown in FIG. 3, due to the dielectric material of the capacitors, there is likelihood that the electric capacitance largely depends on the voltage. For example, the electric capacitance of the dielectric material used to the capacitor with B characteristic or the aluminum electrolytic capacitor is substantially constant. On the other hand, the electrical capacitance of the capacitors with F characteristic largely falls, for example, to 60%, when the voltage falls. Therefore, it is difficult to correctly detect the electrical capacitance.

According to the present embodiment, when the voltage applied to the capacitor W deflects from the voltage between the upper-limit and lower-limit values, the determining part 12 determines that the voltage changes, and then based on the determining result, the warning part 12 performs the warning process. Because of this, it is possible to prevent from occurring of inaccuracy of the electrical capacitance due to variance of the voltage.

Furthermore, when the determining part 12 determines that the voltage changes, the conveyance apparatus 13 of the capacitors W may be stopped based on the signal from the determining part 12.

Furthermore, although an example including the determining part 12 inside of the apparatus of measuring capacitance has been explained in the above-mentioned embodiment, the determining part 12 may be provided separately from the apparatus 10 of measuring capacitance as shown by chain double-dashed line in FIG. 1.

What is claimed is:

1. An apparatus measuring capacitance, comprising:
    a voltmeter measuring the voltage applied to the capacitor;
    an amperemeter measuring a current flowing through the capacitor when the voltage is applied to the capacitor;
    a determining part determining whether or not the voltage applied to the capacitor deflects from voltage between upper-limit and lower-limit values; and
    a capacitance measuring part measuring electrical capacitance based on signals from said voltmeter and said amperemeter, when determined that the voltage applied to the capacitor does not deflect from the voltage between upper-limit and lower-limit values.

2. The apparatus of measuring capacitance according to claim 1, further comprising a warning part for performing the warning when said determining part determines that the voltage applied to the capacitor deflects from the voltage between upper-limit and lower-limit values.

3. The apparatus of measuring capacitance according to claim 2, wherein said warning part performs the warning by at least one of sound and screen display.

4. The apparatus of measuring capacitance according to claim 1, further comprising a conveyance apparatus for conveying a plurality of capacitors in order,
    wherein said determining part determines whether or not the voltage applied to the capacitor deflects from the voltage between upper-limit and lower-limit values at each capacitor that said conveyance apparatus conveys, and
    said capacitance measuring part measures the electrical capacitance of each capacitor determined by said determining part that the applied voltage does not deflect from the voltage between the upper-limit and lower-limit values.

5. The apparatus of measuring capacitance according to claim 4, further comprising a conveyance control part for allowing conveyance by said conveyance apparatus to stop, when determined by said determining part that the voltage applied to the capacitor deflects from the voltage between the upper-limit and the lower-limit values.

6. The apparatus of measuring capacitance according to claim 1, wherein said determining part performs determining process only when measuring capacitance of the capacitor in which a ratio of capacitance variance for a variance of the voltage applied to the capacitor exceeds a prescribed reference amount.

7. The apparatus of measuring capacitance according to claim 6, wherein said determining part performs determining process when measuring the capacitance of the capacitors with dependency of voltage.

8. The apparatus of measuring capacitance according to claim 1,
    wherein said power supply is connected between one end of the capacitor and a common ground terminal,
    said voltmeter is connected between one end and the other end of the capacitor, and
    said amperemeter is connected to the other end of the capacitor.

9. The apparatus of measuring capacitance according to claim 8,
    the other end of the capacitor is controlled so as to become the same voltage as that of said common ground terminal.

10. A method of measuring capacitance, said method comprising the steps of:
    measuring a voltage applied to a capacitor at a state of supplying the voltage to the capacitor;
    measuring a current flowing through the capacitor at a state that a voltage is applied to the capacitor;
    determining whether or not the voltage applied to the capacitor deflects from a voltage between upper-limit and lower-limit values; and
    measuring electrical capacitance of the capacitor based on results of said measuring the voltage applied to the capacitor and the current flowing through the capacitor, when determined that the voltage applied to the capacitor does not deflect from the voltage between upper-limit and lower-limit values.

11. The method of measuring capacitance according to claim 10, further comprising a step for performing warning when determined that the voltage applied to the capacitor deflects from the voltage between upper-limit and lower-limit values.

12. The method of measuring capacitance according to claim 11, wherein said step of performing the warning warns by at least one of sound and screen display.

13. The method of measuring capacitance according to claim 10, further comprising a step of conveying a plurality of capacitors in order,
 wherein said step of performing determination determines whether or not the voltage applied to the capacitor deflects from the voltage between upper-limit and lower-limit values at each of the conveyed capacitors, and
 said step of measuring said electrical capacitance measures the electrical capacitance at each of the capacitors determined that the applied voltage does not deflect from the voltage between the upper-limit and lower-limit values.

14. The method of measuring capacitance according to claim 13, further comprising a step for allowing conveyance of the capacitors to stop when determined that the voltage applied to the capacitors deflects from the voltage between upper-limit and lower-limit values.

15. The method of measuring capacitance according to claim 10, wherein said step of performing determination performs determination only when measuring capacitance of the capacitors in which ratio of capacitance variance for a variance of the voltage applied to the capacitor exceeds a prescribed reference amount.

16. The method of measuring capacitance according to claim 15, wherein said step of performing determination performs determination when measuring capacitance of the capacitors with dependency of voltage.

17. The method of measuring capacitance according to claim 10,
 wherein said power supply is connected between one end of the capacitor and a common ground terminal,
 said voltmeter is connected between one end and the other end of the capacitor, and
 said amperemeter is connected to the other end of the capacitor.

18. The method of measuring capacitance according to claim 17,
 the other end of the capacitor is controlled so as to become the same voltage as that of said common ground terminal.

* * * * *